United States Patent
Schelter et al.

[11] Patent Number: 6,154,025
[45] Date of Patent: Nov. 28, 2000

[54] CONTACTLESS POTENTIOMETER AND DEVICE FOR CONTACTLESSLY SENSING A POSITION OF AN OBJECT

[75] Inventors: Wolfgang Schelter, Tegernheim; Wolfgang Clemens, Puschendorf; Ludwig Schmidt, München; Michael Vieth, Möhrendorf, all of Germany

[73] Assignee: Siemens AG, Munich, Germany

[21] Appl. No.: 09/043,818

[22] PCT Filed: Sep. 13, 1996

[86] PCT No.: PCT/DE96/01729

§ 371 Date: Aug. 17, 1998

§ 102(e) Date: Aug. 17, 1998

[87] PCT Pub. No.: WO97/13120

PCT Pub. Date: Apr. 10, 1997

[30] Foreign Application Priority Data

Sep. 29, 1995 [DE] Germany .................... 195 36 433

[51] Int. Cl.$^7$ .............. G01B 7/30; G01R 33/09; G01D 5/16
[52] U.S. Cl. ............ 324/207.21; 324/174; 324/252; 338/32 R
[58] Field of Search .................. 324/173, 174, 324/207.21–207.25, 252; 360/113; 338/32 R; 323/368

[56] References Cited

U.S. PATENT DOCUMENTS

| | | | |
|---|---|---|---|
| 4,754,221 | 6/1988 | Ao et al. | 324/207.21 |
| 5,574,364 | 11/1996 | Kajimoto et al. | 324/207.21 |
| 5,650,721 | 7/1997 | van den Berg et al. | 324/207.21 |
| 5,744,950 | 4/1998 | Seefeldt | 324/207.21 X |
| 5,841,275 | 11/1998 | Spies | 324/207.24 |

FOREIGN PATENT DOCUMENTS

| | | |
|---|---|---|
| 483 373 | 11/1991 | European Pat. Off. . |
| 25 32 985 | 2/1976 | Germany . |
| 33 08 404 | 6/1985 | Germany . |
| 35 26 338 | 3/1988 | Germany . |
| 42 32 244 | 3/1994 | Germany . |
| 42 43 357 | 6/1994 | Germany . |
| 42 43 358 | 6/1994 | Germany . |
| 44 11 808 | 10/1994 | Germany . |
| WO 94/17426 | 8/1994 | WIPO . |
| WO 95/10020 | 4/1995 | WIPO . |

OTHER PUBLICATIONS

Siemens Magnetic Sensors Data Book, "Hall–effect Generators", 1989, pp. 56–59.

Primary Examiner—Gerard Strecker
Attorney, Agent, or Firm—Kenyon & Kenyon

[57] ABSTRACT

A position sensing device (2) has a magnetic field generating device (3) with at least one magnetic pole ($4_j$) and a sensor device (5) with at least one sensor (6) with an enhanced, specifically a giant magnetoresistive, effect. The magnetic field generating device (3) is arranged with respect to the sensor device (5) in such a way that the direction of a normal ($H_1$) to the plane of the sensor (6) runs at an angle different from zero with respect to an imaginary reference line ($L_1$) on which the at least one magnetic pole ($4_j$) is located, and the magnetic field generating device (3) is to be moved with respect to the sensor device (5) so that the magnetic field (h) of the at least one magnetic pole ($4_j$) is detected by the sensor (6), causing a sweep through at least part of the sensor characteristic, with the number of sweeps determined by the number of magnetic poles detected.

66 Claims, 4 Drawing Sheets

CONTACTLESS POTENTIOMETER AND DEVICE FOR CONTACTLESSLY SENSING A POSITION OF AN OBJECT

FIELD OF THE INVENTION

The present invention relates to a device for determining the position of an object with respect to a predetermined initial position without contact, as well as to a use of the device as a contactless potentiometer.

RELATED TECHNOLOGY

In layers of ferromagnetic transition metals such as Ni, Fe or Co or alloys thereof, the electric resistance may depend on the size and direction of a magnetic field permeating the material. The effect occurring with such layers is called "anisotropic magnetoresistance (AMR)" or "anisotropic magnetoresistive effect." It is based physically on the different scattering cross sections of electrons with a different spin and spin polarity of the D band. The electrons are referred to as majority and minority electrons. For the corresponding magnetoresistive sensors, a thin layer of such a magnetoresistive material, with magnetization in the plane of the layer, is generally provided. The change in resistance when the magnetization is rotated with respect to the direction of a current passed through the sensor may then amount to a few percent of the normal isotropic (=ohmic) resistance. Furthermore, it has long been known that magnetoresistive multilayer systems may be designed containing ferromagnetic layers arranged in a stack, with the layers separated by intermediate metallic layers and with the magnetization always lying in the plane of the layer. The thickness of the individual layers is selected so it is much smaller than the mean free path length of the conduction electrons. In such multilayer systems, a "giant magnetoresistive effect" or "giant magnetoresistance (GMR)" may also occur in addition to the above-mentioned anisotropic magnetoresistive effect AMR (see, for example, European Patent EP-A 483, 373). Such a GMR effect is based on the difference in scattering of majority and minority conduction electrons at the interfaces between the ferromagnetic layers and the adjacent layers as well as scattering effects within these layers, in particular when using alloys. The GMR effect is an isotropic effect, which can be much greater than the anisotropic effect AMR. In such multilayer systems having a GMR effect, adjacent metallic layers are at first oppositely magnetized, with a bias layer or a bias layer part being magnetically harder than a measurement layer. Under the influence of an external magnetic field, i.e., a component of this field which is manifested in the plane of the layer, the initial antiparallel orientation of the magnetizations may then be converted to a parallel orientation. This fact is utilized in corresponding magnetic field sensors.

Such a sensor is derived from International Patent Application WO94/17426. It is part of a device for contactless determination of an angular position of an object. For this purpose, the object is rigidly connected to a permanent magnet which is rotatably arranged in a plane parallel to a measurement layer plane. This magnet generates in the measurement layer a magnetic field component which is thus rotatable with respect to a preferential magnetic axis of a bias part of the sensor and therefore causes the magnetization in the magnetically softer measurement layer to rotate in a similar manner. The electric resistance of the sensor thus depends on the angle between the magnetization of the measurement layer and the preferential direction of magnetization of the bias part. This dependence is generally anisotropic owing to the predetermined shape (geometry) of the layer structure of the sensor. Such a device for detecting an angular position, which may form a contactless potentiometer in particular, is restricted, however, to a common axis of symmetry of the magnet and the sensor about which either the magnet or the sensor itself is rotatably arranged.

SUMMARY OF THE INVENTION

An object of the present invention is to provide a device in which the above-described restriction is at least substantially eliminated.

This object is achieved according to the present invention by the fact that the magnetic field generating device forms a magnetic pole on an imaginary reference line or forms several magnetic poles aligned one after the other along this line, with said magnetic poles generating alternating magnetic field directions, and said magnetic field generating device being arranged with respect to the sensor device so that the direction of a normal to the plane of the measurement layer of the at least one sensor forms an angle different from zero with the imaginary reference line of the at least one magnetic pole. In addition, the magnetic field generating device should be movable relative to the sensor device so that the magnetic field of the at least one magnetic pole is detected by the measurement layer of the at least one sensor, and multiple sweeps of all or part of the sensor characteristic, the number of sweeps corresponding to the number of magnetic poles detected, are effected.

The advantages associated with this embodiment of the position sensing device can be seen in particular in the fact that first, contactless detection of linear positions or angular positions of objects can be implemented in the entire angle range of 360°, and second, it allows a lower degree of accuracy of the assembly positions of the magnetic field generating device and the sensor devices. By using at least one sensor for the sensor device having a layer system with an enhanced magnetoresistive effect, essentially only the dependence of the sensor measurement signal on the direction of the external magnetic field, but not on its field strength, is utilized in passing the at least one magnetic pole by the side of the sensor device at the reference line.

Such a position sensing device makes it possible to construct a contactless potentiometer to particular advantage.

BRIEF DESCRIPTION OF THE DRAWINGS

To further illustrate the present invention, reference is made below to the drawings, which shows schematically.

Corresponding parts in the figures are provided with the same reference notation.

DETAILED DESCRIPTION

Figure 1:
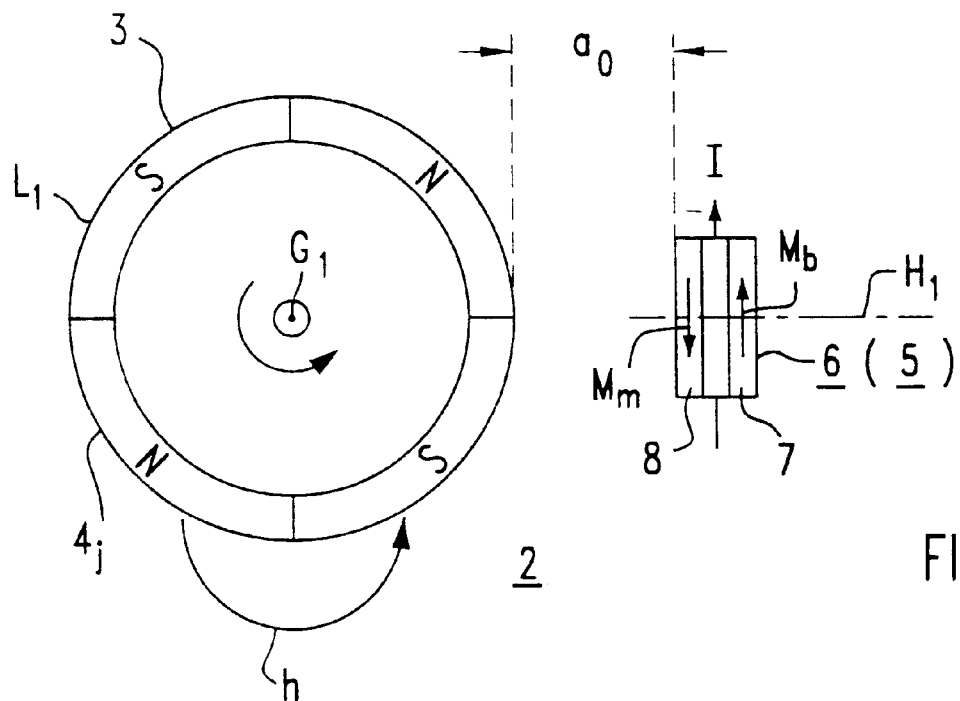
FIGS. 1 and 2: side and top views of a first embodiment of a rotational position sensing device according to the present invention with a magnet wheel.

With a device according to the present invention, a linear position or a rotational position of any object can be determined without contact. The device has two main units, namely a device for generating a magnetic field component and a device for detecting this magnetic field component to generate an output signal which depends essentially only on the direction of the magnetic field. One of these two devices is rigidly connected to the object, so that its position can be detected relative to a predetermined starting position or relative to the position of the other device. The magnetic field generating device has one or more magnetic poles facing the detection device and to be passed by the latter one or more times. If only one magnetic pole is provided, it can be regarded as lying on an imaginary reference line. If there are multiple magnetic poles, they should be aligned one after the other along a corresponding imaginary reference line; the magnetic fields generated by the magnetic poles should have variable, preferably alternating or periodic changes in magnetic field directions along this line with regard to the detection device. The reference line may be a straight or curved line. In the case of a straight line in particular, detection of a linear position of an object is possible. With a curved line, a circumferential line of a circle may be modeled, such as that formed by a magnet wheel, for example.

Thus, preferably angular positions between 0° and 360° can be detected. The device which is sensitive with regard to the direction of the magnetic field and is to be regarded as a sensor device comprises at least one current-carrying sensor. A plurality of such sensors may be wired together electrically to form the sensor device and may form a Wheatstone bridge, for example. Each sensor has a multilayer system which has an enhanced magnetoresistive effect, in particular a GMR effect. Therefore, the layer system contains at least one magnetically softer measurement layer with a magnetization that can rotate in the plane of the layer. Parallel to this there is arranged a bias part with a bias layer or a bias layer system, where the bias part is magnetically harder and has an at least largely unchanged magnetization under the influence of the magnetic field of the at least one magnetic pole. Similar multilayer systems with a GMR effect are known, for example, from European Patent EP-A 483,373, German Patents DE-A 42 32 244, DE-A 42 43 357 or DE-A 42 43 358.

With a position sensing device having these features, its magnetic field generating device should be arranged with regard to the sensor device in a predetermined manner according to the present invention:

A normal to the plane of the measurement layer of the multilayer system of the at least one sensor and the imaginary reference line on which the at least one magnetic pole of the magnetic field generating device lies shall be considered for this purpose. Then the direction of the normal should form an angle different from zero with the reference line at the point nearest the measurement layer. Preferably this angle should be at least approximately 90°. The reference line is then in a plane at least approximately parallel to the plane of the measurement layer.

In addition, the magnetic field generating device and the sensor device should be movable relative to one another so that the magnetic field of the at least one magnetic pole of the magnetic field generating device is detected by the measurement layer of the multilayer system of the at least one sensor, and when the at least one magnetic pole is guided through the detection range of the sensor device it causes multiple sweeps of all or part of the sensor characteristic corresponding in number to the number of magnetic poles present and detected. The sensor characteristic is regarded as the resistance values that can be assumed by the sensor device as a magnetic pole passes by its at least one measurement layer and can be represented in a diagram.

It is of course also possible for the magnetic poles of the magnet field generating device to be passed repeatedly through the detection range of the sensor device (or vice versa). Then all or part of the sensor characteristic is swept a number of times, where the number of sweeps corresponds to the total number of magnetic poles detected in succession by the sensor device.

The figures show some embodiments of such rotational and linear position sensing devices according to this invention. Parts not shown in greater detail are of general knowledge, so they are not described below.

Figure 2:
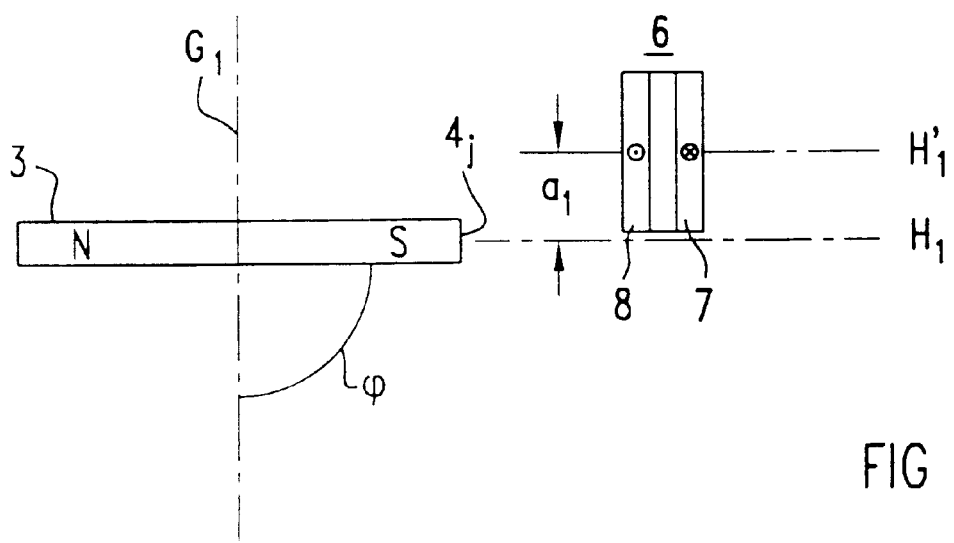

According to the embodiment of such a device 2 for detecting a rotational position as indicated in FIGS. 1 and 2, the magnetic field generating device is designed as a magnet wheel 3. Magnet wheel 3 is mounted on the axle of an electric motor, for example, so it can rotate about a reference axis $G_1$. It has magnetic poles $4_j$ of alternating polarity arranged one after the other, as seen in the circumferential direction, on a reference line $L_1$ running along its outer circumference. Of the n magnetic poles (where $1 \leq j \leq n$), only four are shown in the figure, two having a polarity of N (=north pole) and two having a polarity of S (=south pole). The magnetic field between adjacent poles of different polarities is indicated by a field line h.

Magnet wheel 3 is arranged at a distance $a_0$ of its reference line $L_1$ from sensor 6 of sensor device 5. The sensor, which is not shown to scale with respect to the magnet wheel in the figures, has a current I flowing through it and has a multilayer system with a layer part 7 having a fixed magnetization $M_b$, a bias part, and a magnetically soft measurement layer 8 with a magnetization $M_m$ which can rotate in the plane of the layer. A normal to the surface plane of the layer package of the multilayer system of sensor 6 or of measurement layer 8 shall be designated as $H_1$.

According to the present invention, sensor 6 is arranged with respect to magnet wheel 3 so that reference axis $G_1$ (=axis of rotation) of the magnet wheel is not parallel to normal $H_1$ to the plane of the sensor. As FIGS. 1 and 2 show, reference axis $G_1$ and normal $H_1$ form an angle $\phi$ with a value not equal to zero, preferably an angle $\phi$ of at least approximately 90°. Then with a rotation of magnet wheel 3 about reference axis $G_1$, magnetic poles $4_j$ face sensor 6 directly with their pole faces one after the other.

With such a rotation, there are n sweeps through the resistance characteristic of giant magnetoresistive sensor 6. The direction of magnetization $M_m$ of the magnetically soft measurement layer 8 in giant magnetoresistive sensor 6 follows the acting magnetic field over a wide range of the field, and the change in resistance of the multilayer package depends only on the angle of magnetization $M_m$ in the measurement layer and $M_b$ in the bias part, so therefore the signal delivered by the sensor, reflecting the angular position of magnet wheel 3, is advantageously independent of the distance $a_0$ between the magnet wheel and the sensor over a wide range.

As FIG. 2 also shows, normal $H_1$ need not necessarily represent central axis $H_1'$ of sensor 6, but instead it may be shifted by a distance $a_1$ relative to this axis.

Due to the high sensitivity of giant magnetoresistive sensors, no differential arrangement is necessary with the position sensing device according to this invention, such as that required, for example, with Hall sensors (see, for example, the informational brochure *Magnetic Sensors* from Siemens AG, 1989, page 57); this permits smaller distances between pole centers on a magnet wheel, so that a higher resolution and/or miniaturization can be achieved accordingly.

With the rotational position sensing device 2 shown in FIGS. 1 and 2, a partition or housing wall can be inserted into the space between magnet wheel 3 and sensor 6 characterized by the distance $a_0$. This wall must be made of a nonferromagnetic material. Such a design can be provided in particular when the magnet wheel or the sensor are to be built into a housing, for example, or are to be arranged in different ambient media which are to be separated by a partition.

Figure 3:
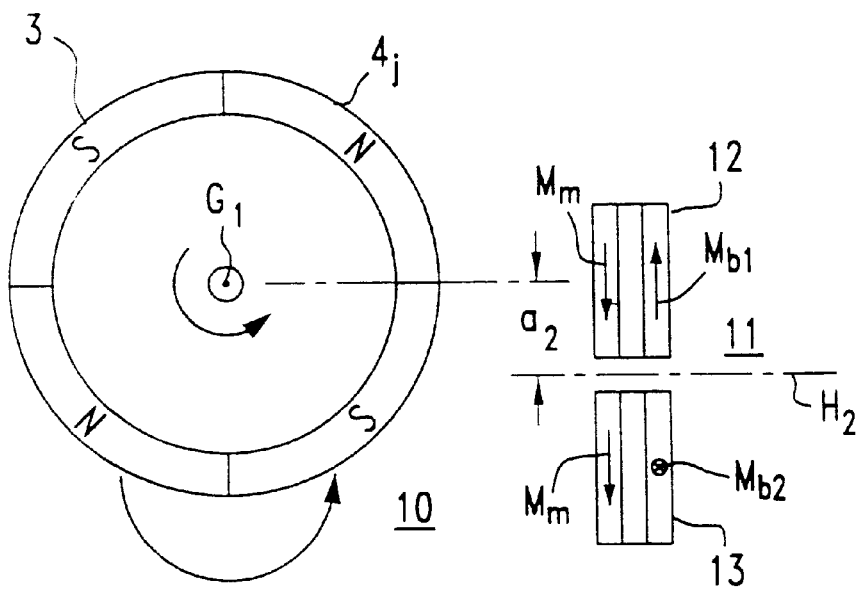
FIGS. 3 and 4: side views of second and third embodiments of a corresponding device.

The embodiment of a device 10 shown in FIG. 3 for detecting the rotational position of a magnet wheel 3 (according to FIG. 1) with n magnetic poles $4_j$ has a sensor device 11 with a pair of magnetoresistive sensors 12 and 13. In the figure, the sensors have not been drawn to scale with respect to the magnet wheel—they have been enlarged for the sake of clarity. They are electrically wired together and current I is flowing through them. Their multilayer systems are in a common plane and are oriented relative to one another so that the directions of magnetization $M_{b1}$ and $M_{b2}$ of their bias parts are preferably perpendicular to one another. A reference axis $H_2$, which is common to the sensors, points in the direction of a normal to the plane of the sensors and runs centrally between the sensors which are spaced a distance apart, forms a 90° angle with the axis of rotation $G_1$ of magnet wheel 3. Reference axis $H_2$ is shifted laterally by a distance $a_2$ relative to this axis of rotation, where $a_2$ should be much smaller than half a period of the distance between pole centers of adjacent magnetic poles. As magnet wheel 3 revolves about its axis $G_1$, there are n sweeps (per pole revolution) through the resistance characteristic of the giant magnetoresistive sensor, with the two sensors each supplying a periodic signal with a 90° phase shift. This leads to better scanning of the basic resolution, determined by the number of poles of the magnet wheel, than could be achieved with two Hall sensors arranged side by side while maintaining a predetermined distance. The two GMR sensors 12 and 13 may advantageously be arranged side by side in direct proximity, e.g., on one chip. In addition, the embodiment illustrated here advantageously makes it possible to detect the direction of rotation.

Figure 4:
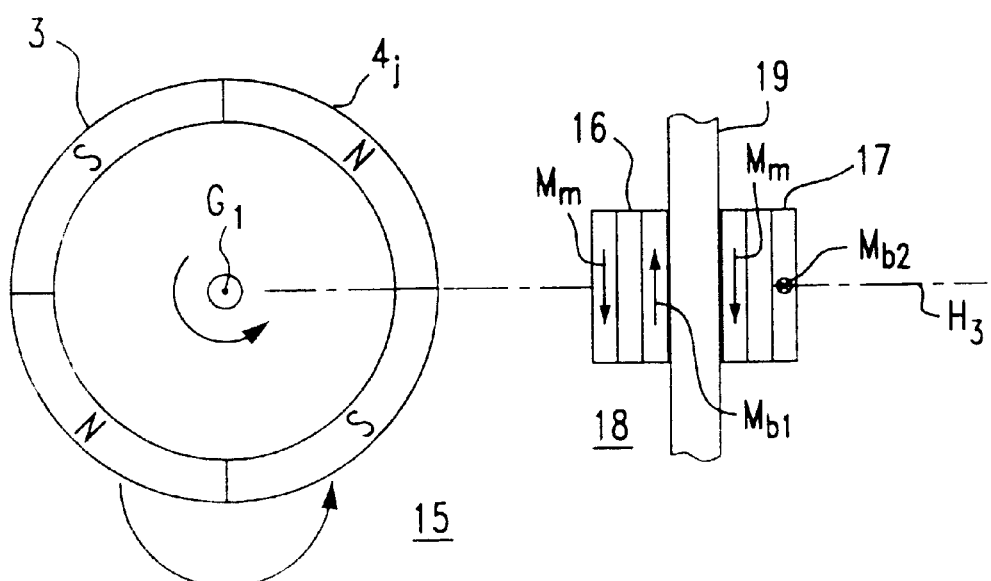

In deviation from position sensing device 10 according to FIG. 3, giant magnetoresistive sensors 16 and 17 of sensor device 18 are not arranged in a common plane in the embodiment of a rotational position sensing device 15 shown in FIG. 4, but instead they are in parallel planes. The multilayer systems of the sensors may be constructed either by the hybrid method or by suitable coating and structuring of a wafer 19 either on both of its opposing flat sides or on one side. The sensors have a common reference axis $H_3$ in the direction of the normals to their surfaces. Reference axis $H_3$ running in the central area of the sensors, for example, in turn forms an angle of 90° with the axis of rotation $G_1$ of magnet wheel 3. Owing to the allowed tolerances in the distance, the sensors of device 15 deliver a signal having at least approximately the same amplitude but in phase quadrature.

Figure 5:
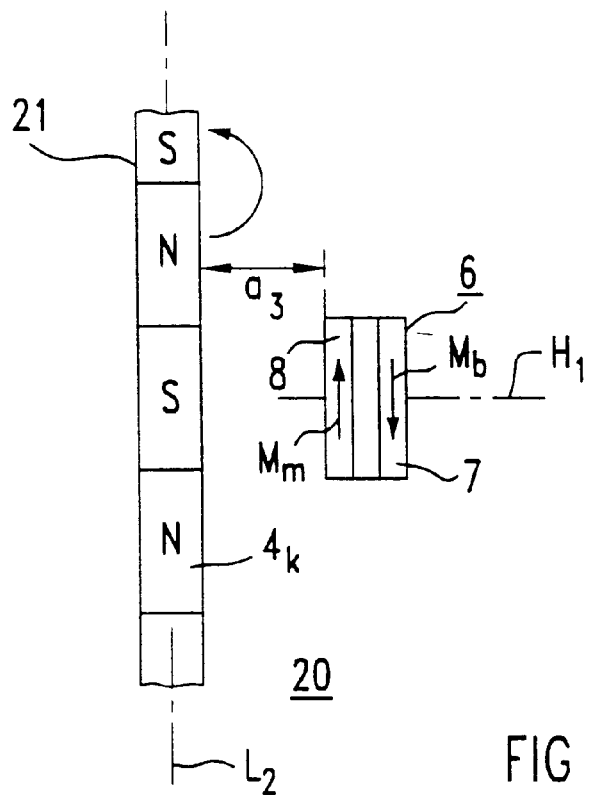
FIG. 5: a side view of one embodiment of a linear position sensing device according to the present invention with a linear pole arrangement.

According to FIGS. 1 through 4, it has been assumed that a reference line $L_1$ of the magnetic poles of a magnetic field generating device describes a circumferential line of magnet wheel 3. It is equally possible, however, for the reference line to also form a straight line. A corresponding embodiment of a linear position sensing device is illustrated in FIG. 5. This device 20 contains as the magnetic field generating device a magnetic strip 21 which extends along a straight reference line $L_2$ with n successive magnetic poles $4_k$ (where $1 \leq s \ k \leq n$) of alternating polarity. Reference line $L_2$ runs perpendicular to normal $H_1$ on giant magnetoresistive sensor 6 (e.g., according to FIG. 1). A distance $a_3$ is maintained between the multilayer system of the sensor and magnetic strip 21. With the movement of sensor 6 along a parallel line at a distance $a_3$ from reference line $L_2$ or with a movement of the magnetic strip along reference line $L_2$, there are n sweeps through the resistance characteristic of giant magnetoresistive sensor 6. Since the direction of magnetization $M_m$ of magnetically soft measurement layer 8 of sensor 6 follows the acting magnetic field of magnetic strip 21 over a wide range of the field, and since the change in resistance of the multilayer system of the sensor depends only on the angle of magnetization $M_m$ in its measurement layer and $M_b$ in its bias part 7 or in the bias layer, the signal delivered by the sensor device, reflecting the position of magnetic strip 21, is advantageously independent of distance $a_3$ between magnetic strip 21 and sensor 6 over a wide range.

Figure 7:
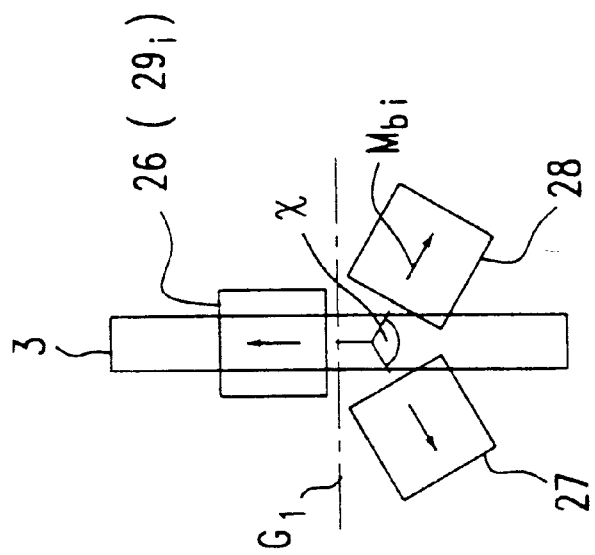
FIG. 7: a top view of the device according to FIG. 6.
Figure 6:
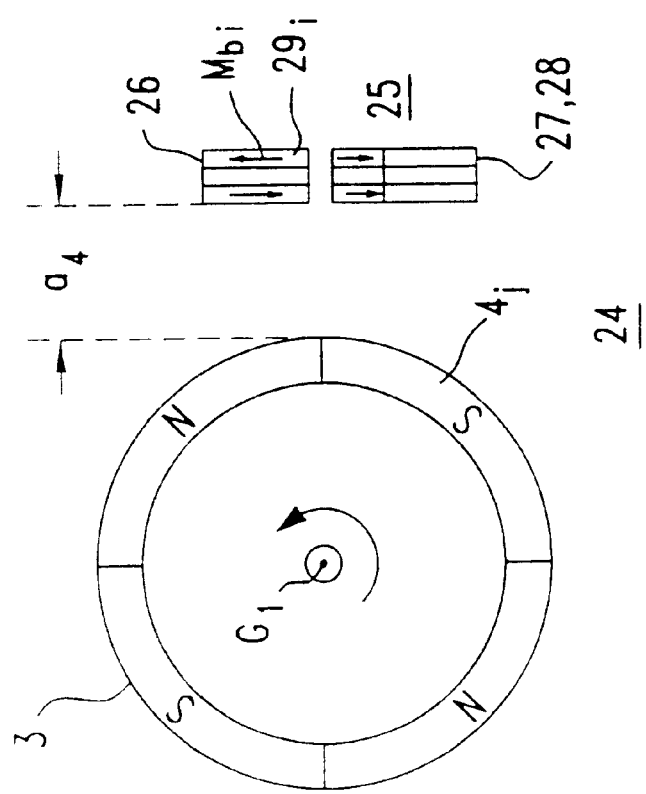
FIG. 6: a side view of a fourth embodiment of a rotational position sensing device according to the present invention with a magnet wheel.

The embodiments of the position sensing devices according to the present invention as shown in FIGS. 1 through 5 provide for the reference axes or normals to their sensors or sensor devices to be at least approximately perpendicular to the axis of rotation $G_1$ and/or perpendicular to reference lines $L_1$ and $L_2$. However, a position sensing device according to the present invention is not limited to such angles between the normals and the reference lines. Instead, angles greater or smaller than 90° can be selected, preferably from the range between 60° and 120°. Since the direction of magnetization $M_m$ of the magnetically soft measurement layer in a giant magnetoresistive sensor follows the direction of the acting magnetic field in a wide range of the field and the change in resistance of its multilayer system depends only on the angle between the directions of magnetization $M_m$ in the measurement layer and $M_b$ in the bias part, the signal delivered by the multilayer system, reflecting the angular position of a magnet wheel, for example, is independent of the angle between a normal to the plane of the measurement layer of a multilayer system and the reference line of the at least one magnetic pole over a wide range. This permits high fitting tolerances in the manufacture and assembly of such systems in an advantageous manner, and this means that different units of the same system may have different angles from the aforementioned angle range without causing practically any change in their electric function. A corresponding embodiment is illustrated in FIGS. 6 and 7.

With the position sensing device 24 shown in these figures, instead of the arrangement of a sensor device with two sensors shown in FIGS. 3 and 4, now such a device 25 with more than two sensors, e.g., three sensors 26 to 28 lying in a plane, is used. These sensors, which are a distance $a_4$ from magnet wheel 3, are preferably arranged at an angle x=120° of their surface axes that. are in the sensor plane or of directions of magnetization $M_{bi}$ of their bias parts $29_i$ (where $1 \leq i \leq 3$) to one another. Therefore, only two linear ranges of 60° each are needed by each sensor for 360° detection instead of 90° each as in the embodiment according to FIGS. 3 and 4.

Figure 8:
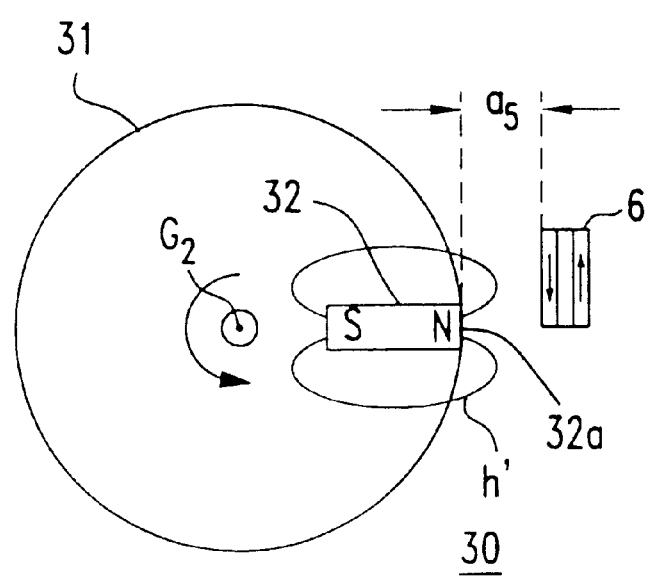
FIG. 8: a side view of a fifth embodiment of a rotational position sensing device according to the present invention with another magnet wheel.

FIG. 8 shows one embodiment of a rotational position sensing device 30 with a magnet wheel 31 as the magnetic field generating device having only a single magnetic double pole 32. The double pole, which may be in the form of a rod magnet, for example, is arranged so that it extends radially with respect to the axis of rotation $G_2$ of magnet wheel 31. In other words, only one magnetic pole 32a of this rod magnet is facing giant magnetoresistive sensor 6 (e.g., according to FIG. 1) of a sensor device while maintaining a distance $a_5$. The magnetic field produced by the bar magnet is indicated by field lines h'. Device 30 shown here can be used in particular for generating trigger pulses or counting pulses.

What is claimed is:

1. A device for contactless sensing of a position of an object with respect to a predetermined starting position, comprising:

a magnetic field generating device having at least one magnetic pole at an imaginary reference line, the at least one magnetic pole having a magnetic field; and a sensor device including at least one current-carrying sensor having an enhanced magnetoresistive effect which is isotropic, the at least one sensor having a layer system including at least one magnetically soft measurement layer having a measurement layer magnetization capable of rotation in a plane of the measurement layer and at least one magnetically harder bias part having a substantially unchangeable bias part magnetization, wherein one of the sensor device and the magnetic field generating device is in a fixed relation to the object, wherein the magnetic field generating device is arranged with respect to the sensor device such that the at least one magnetic pole faces the measurement layer during a particular time period, a normal to the plane of the measurement layer being at an angle different from zero with respect to the imaginary reference line, wherein the magnetic field generating device is movable relative to the sensor device such that the magnetic field of the at least one magnetic pole may be detected by the measurement layer and such that at least a part of a characteristic curve of the at least one sensor is passed through for a number of times which corresponds to a number of the at least one detected magnetic pole, and wherein the at least one current-carrying sensor generates a measurement signal which is dependent only on a direction of the magnetic field.

2. The device as recited in claim 1 wherein the imaginary reference line approximates a straight line.

3. The device as recited in claim 2 wherein the at least one sensor includes a plurality of electrically interconnected sensors.

4. The device as recited in claim 3 wherein the plurality of electrically interconnected sensors is a first sensor having a first layer system having a first bias part with a first magnetization direction and a second sensor having a second layer system having a second bias part with a second magnetization direction, the first magnetization direction forming approximately a right angle to the second magnetization direction.

5. The device as recited in claim 3 wherein the plurality of electrically interconnected sensors are three sensors having layer system bias parts having bias part magnetization directions forming an angle of approximately 120° to one another.

6. The device as recited in claim 5 wherein the plurality of electrically interconnected sensors are in a common plane.

7. The device as recited in claim 5 wherein the plurality of electrically interconnected sensor are in parallel planes.

8. The device as recited in claim 4 wherein the plurality of electrically interconnected sensors are in a common plane.

9. The device as recited in claim 4 wherein the plurality of electrically interconnected sensor are in parallel planes.

10. The device as recited in claim 3 wherein the plurality of electrically interconnected sensors are in a common plane.

11. The device as recited in claim 3 wherein the plurality of electrically interconnected sensor are in parallel planes.

12. The device as recited in claim 1 wherein the imaginary reference line approximates a circumferential line of a magnet wheel.

13. The device as recited in claim 12 wherein the at least one sensor includes a plurality of electrically interconnected sensors.

14. The device as recited in claim 13 wherein the plurality of electrically interconnected sensors is a first sensor having a first layer system having a first bias part with a first magnetization direction and a second sensor having a second layer system having a second bias part with a second magnetization direction, the first magnetization direction forming approximately a right angle to the second magnetization direction.

15. The device as recited in claim 13 wherein the plurality of electrically interconnected sensors are three sensors having layer system bias parts having bias part magnetization directions forming an angle of approximately 120° to one another.

16. The device as recited in claim 15 wherein the plurality of electrically interconnected sensors are in a common plane.

17. The device as recited in claim 15 wherein the plurality of electrically interconnected sensor are in parallel planes.

18. The device as recited in claim 14 wherein the plurality of electrically interconnected sensors are in a common plane.

19. The device as recited in claim 14 wherein the plurality of electrically interconnected sensor are in parallel planes.

20. The device as recited in claim 13 wherein the plurality of electrically interconnected sensors are in a common plane.

21. The device as recited in claim 13 wherein the plurality of electrically interconnected sensor are in parallel planes.

22. The device as recited in claim 1 wherein the at least one sensor includes a plurality of electrically interconnected sensors.

23. The device as recited in claim 22 wherein the plurality of electrically interconnected sensors is a first sensor having a first layer system having a first bias part with a first magnetization direction and a second sensor having a second layer system having a second bias part with a second magnetization direction, the first magnetization direction forming approximately a right angle to the second magnetization direction.

24. The device as recited in claim 22 wherein the plurality of electrically interconnected sensors are three sensors having layer system bias parts having bias part magnetization directions forming an angle of approximately 120° to one another.

25. The device as recited in claim 24 wherein the plurality of electrically interconnected sensors are in a common plane.

26. The device as recited in claim 24 wherein the plurality of electrically interconnected sensor are in parallel planes.

27. The device as recited in claim 23 wherein the plurality of electrically interconnected sensors are in a common plane.

28. The device as recited in claim 23 wherein the plurality of electrically interconnected sensor are in parallel planes.

29. The device as recited in claim 22 wherein the plurality of electrically interconnected sensors are in a common plane.

30. The device as recited in claim 22 wherein the plurality of electrically interconnected sensor are in parallel planes.

31. The device as recited in claim 1 wherein the at least one magnetic pole includes a plurality of magnetic poles arranged in a row along the imaginary reference line for generating alternating magnetic field directions.

32. A contactless potentiometer, comprising:
- a magnetic field generating device having at least one magnetic pole at an imaginary reference line, the at least one magnetic pole having a magnetic field; and
- a sensor device including at least one current-carrying sensor having an enhanced magnetoresistive effect which is isotropic, the at least one sensor having a layer system including at least one magnetically soft measurement layer having a measurement layer magnetization capable of rotation in a plane of the measurement layer and at least one magnetically harder bias part having a substantially unchangeable bias part magnetization,
- wherein one of the sensor device and the magnetic field generating device is in a fixed relation to an object,
- wherein the magnetic field generating device is arranged with respect to the sensor device such that the at least one magnetic pole faces the measurement layer during a particular time period, and a normal to the plane of the measurement layer is at an angle different from zero with respect to the imaginary reference line,
- wherein the magnetic field generating device is movable relative to the sensor device such that the magnetic field of the at least one magnetic pole may be detected by the measurement layer and such that at least a part of a characteristic curve of the at least one sensor is passed through for a number of times which corresponds to a number of the at least one detected magnetic pole, and
- wherein the at least one current-carrying sensor generates a measurement signal which is dependent only on a direction of the magnetic field.

33. The contactless potentiometer as recited in claim 32 wherein the imaginary reference line approximates a straight line.

34. The contactless potentiometer as recited in claim 33 wherein the at least one sensor includes a plurality of electrically interconnected sensors.

35. The contactless potentiometer as recited in claim 34 wherein the plurality of electrically interconnected sensors is a first sensor having a first layer system having a first bias part with a first magnetization direction and a second sensor having a second layer system having a second bias part with a second magnetization direction, the first magnetization direction forming approximately a right angle to the second magnetization direction.

36. The contactless potentiometer as recited in claim 34 wherein the plurality of electrically interconnected sensors are three sensors having layer system bias parts having bias part magnetization directions forming an angle of approximately 120° to one another.

37. The contactless potentiometer as recited in claim 36 wherein the plurality of electrically interconnected sensors are in a common plane.

38. The contactless potentiometer as recited in claim 36 wherein the plurality of electrically interconnected sensor are in parallel planes.

39. The contactless potentiometer as recited in claim 35 wherein the plurality of electrically interconnected sensors are in a common plane.

40. The contactless potentiometer as recited in claim 35 wherein the plurality of electrically interconnected sensor are in parallel planes.

41. The contactless potentiometer as recited in claim 34 wherein the plurality of electrically interconnected sensors are in a common plane.

42. The contactless potentiometer as recited in claim 34 wherein the plurality of electrically interconnected sensor are in parallel planes.

43. The contactless potentiometer as recited in claim 32 wherein the imaginary reference line approximates a circumferential line of a magnet wheel.

44. The contactless potentiometer as recited in claim 43 wherein the at least one sensor includes a plurality of electrically interconnected sensors.

45. The contactless potentiometer as recited in claim 44 wherein the plurality of electrically interconnected sensors is a first sensor having a first layer system having a first bias part with a first magnetization direction and a second sensor having a second layer system having a second bias part with a second magnetization direction, the first magnetization direction forming approximately a right angle to the second magnetization direction.

46. The contactless potentiometer as recited in claim 44 wherein the plurality of electrically interconnected sensors are three sensors having layer system bias parts having bias part magnetization directions forming an angle of approximately 120° to one another.

47. The contactless potentiometer as recited in claim 46 wherein the plurality of electrically interconnected sensors are in a common plane.

48. The contactless potentiometer as recited in claim 46 wherein the plurality of electrically interconnected sensor are in parallel planes.

49. The contactless potentiometer as recited in claim 45 wherein the plurality of electrically interconnected sensors are in a common plane.

50. The contactless potentiometer as recited in claim 45 wherein the plurality of electrically interconnected sensor are in parallel planes.

51. The contactless potentiometer as recited in claim 44 wherein the plurality of electrically interconnected sensors are in a common plane.

52. The contactless potentiometer as recited in claim 44 wherein the plurality of electrically interconnected sensor are in parallel planes.

53. The contactless potentiometer as recited in claim 32 wherein the at least one sensor includes a plurality of electrically interconnected sensors.

54. The contactless potentiometer as recited in claim 53 wherein the plurality of electrically interconnected sensors is a first sensor having a first layer system having a first bias part with a first magnetization direction and a second sensor having a second layer system having a second bias part with a second magnetization direction, the first magnetization direction forming approximately a right angle to the second magnetization direction.

55. The contactless potentiometer as recited in claim 53 wherein the plurality of electrically interconnected sensors are three sensors having layer system bias parts having bias part magnetization directions forming an angle of approximately 120° to one another.

56. The contactless potentiometer as recited in claim 55 wherein the plurality of electrically interconnected sensors are in a common plane.

57. The contactless potentiometer as recited in claim 55 wherein the plurality of electrically interconnected sensor are in parallel planes.

58. The contactless potentiometer as recited in claim 54 wherein the plurality of electrically interconnected sensors are in a common plane.

59. The contactless potentiometer as recited in claim 54 wherein the plurality of electrically interconnected sensor are in parallel planes.

60. The contactless potentiometer as recited in claim 53 wherein the plurality of electrically interconnected sensors are in a common plane.

61. The contactless potentiometer as recited in claim 53 wherein the plurality of electrically interconnected sensor are in parallel planes.

62. The contactless potentiometer as recited in claim 32 wherein the at least one magnetic pole includes a plurality of magnetic poles arranged in a row along the imaginary reference line for generating alternating magnetic field directions.

63. The device according to claim 1, wherein a field strength dependence of the magnetic field is not utilized for contactless sensing by the sensor.

64. The device according to claim 1, wherein the enhanced magnetoresistive effect is provided as function of an angle of rotation of the magnetic field generating device.

65. The contactliess pot entiometer a ccording to claim 32,wherein a field strength dependence of the magnetic field is not utilized for contactless sensing by the sensor.

66. The contactless potentiometer according to claim 32, wherein the enhanced magnetoresistive effect is provided as function of an angle of rotation of the magnetic field generating device.

* * * * *